United States Patent [15] 3,663,308
Davey [45] May 16, 1972

[54] METHOD OF MAKING ION IMPLANTED DIELECTRIC ENCLOSURES

[72] Inventor: John Edmund Davey, Alexandria, Va.
[73] Assignee: The United States of America as represented by the Secretary of the Navy

[22] Filed: Nov. 5, 1970
[21] Appl. No.: 87,027

[52] U.S. Cl. ....148/1.5, 29/576
[51] Int. Cl. ....H01l 7/54
[58] Field of Search ....148/1.5, 187; 29/576

[56] References Cited

UNITED STATES PATENTS

| | | | |
|---|---|---|---|
| 3,390,019 | 6/1968 | Manchester | 148/1.5 |
| 3,515,956 | 6/1970 | Martin et al. | 148/1.5 X |
| 3,586,542 | 6/1971 | MacRae | 148/1.5 |

*Primary Examiner*—L. Dewayne Rutledge
*Assistant Examiner*—J. Davis
*Attorney*—R. S. Sciascia, Arthur L. Branning, James G. Murray and Sol Sheinbein

[57] ABSTRACT

A method of producing electrical isolation between semiconductor devices diffused in a substrate by ion implantation of various species of gases around the semiconductor devices, forming insulating dielectric cups.

2 Claims, 4 Drawing Figures

Patented May 16, 1972 3,663,308

INVENTOR.
JOHN E. DAVEY
BY Sol Shinbein AGENT

ATTORNEY

METHOD OF MAKING ION IMPLANTED DIELECTRIC ENCLOSURES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to a new semiconductor structure, and more particularly to a novel integrated circuit structure having discrete semiconductor regions which are electrically insulated and isolated from one another, and to a method of making such novel structures.

Monolithic integrated circuits normally have a number of active devices such as transistors and diodes formed in a crystal semiconductor element, and passive devices such as resistors and capacitors also formed in or on the same semiconductor element. These devices are interconnected into a circuit by a pattern of metallization on an insulating film covering the surface of the semiconductor element. In order to avoid unwanted electrical interaction of the devices with each other, it is necessary to provide isolation between the active regions of the structure.

Previous research has shown semiconductor devices, particularly integrated circuits, to be sensitive to nuclear radiation. Radiations of major concern in a weapon environment are gamma rays and fast neutrons.

Electrical isolation of functional devices is a critical necessity for non-interacting operation. Various means have been proposed to provide such isolation. For example, p-n junctions fabricated in the semiconductor element between the active regions have been employed in some devices. However, leakage paths coupling all devices (or "latch-up") are still potentially available to the electrical current flowing through the devices. One potential leakage path is from one region to another via the substrate crystal, and a second such path is between devices via the epitaxial layer. Regardless of how the isolating p-n junction is formed, parasitic capacitance is introduced into the circuit structure. Reduction of this capacitance is very desirable so that the operating or switching speed of the structure may be improved.

Various techniques that do not use p-n junctions have been suggested for isolating devices within a monolithic IC. Among these techniques is the oxide isolation scheme in which silicon substrates are prepared for diffusion in a way different from junction isolated circuits. An $n^+$ skin is diffused on an n-type silicon substrate, and a layer of $SiO_2$ grown. Photolithographic techniques are then used to delineate a groove pattern and grooves are chemically etched. Oxide is then grown in these grooves, and a polycrystalline layer grown in the grooved face of the wafer. The top of the poly is then lapped and the exposed single crystal phase is then lapped until all the grooves are exposed. At this point, the wafer is flipped over and the polysilicon now serves as the island-containing regions of device-grade silicon. This method, unfortunately, has proved unrealistic as precision lapping is required.

It has also been proposed to build monolithic integrated circuits by growing a semiconductor crystal epitaxially on an insulating single crystal substrate. Although it is possible to grow a semiconductor crystal on another crystal of a different material, there are many inherent difficulties. Unless there is an almost perfect lattice match between the two chemically different materials, the semiconductor material will not grow in the form of a single crystal, and up to the present time no two materials have been found which have a sufficiently close lattice match to make this a practical manufacturing technique.

SUMMARY OF THE INVENTION

Ion implantation of various species of gases, such as helium, hydrogen or argon at high energies, results in the formation of a narrow amorphous layer in a polycrystalline substrate. The depth of the layer in typical semiconducting crystals such as silicon, can be tailored by appropriate choice of ion species and accelerating voltages. Active devices embedded in these crystals can thus be dielectrically isolated from one another by the placing of such layers around them.

OBJECTS OF THE INVENTION

It is an object of the present invention to provide improved isolation for semiconductor integrated circuit structure.

A further object of the invention is to provide a simple method of manufacturing semiconductor integrated circuit structures having a high degree of isolation of the active regions of the circuit from each other.

Still another object of the invention is to provide an improved method of manufacturing semiconductor integrated circuit structures with greatly reduced parasitic capacitance between devices, which method can be conducted economically on a production scale.

Yet another object of the present invention is to provide silicon monolithic integrated circuits capable of electrical isolation in a radiation environment.

A still further object of the present invention is to provide electrical isolation between semiconductor elements in a substrate without heteroepitaxy, polishing, lapping or etching.

Another object of the present invention is to provide high resistivity layers in semiconductor devices.

DESCRIPTION OF THE DRAWING

These and other objects of this invention will become apparent from the following description and the accompanying drawing, in which.

DESCRIPTION OF THE PREFERRED EMBODIMENT

The present invention is embodied in a semiconductor circuit structure including discrete crystal semiconductor regions, a plurality of which contain devices electrically isolated from other regions in a common substrate which is in the same material as the regions, that is, crystal semiconductor material.

Figure 1A:
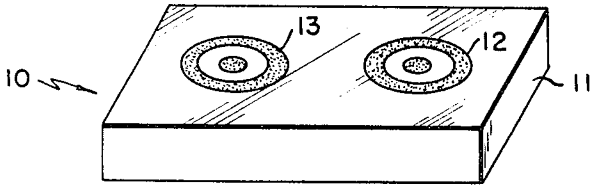
FIG. 1*a* is an isometric view, FIG. 1*b* an end view
Figure 1B:
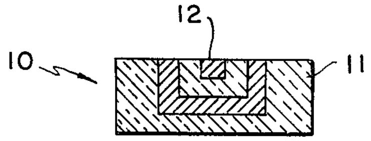
FIGS. 1*c* and 1*d* are cross-sectional views illustrating an integrated circuit structure of the invention at different stages of its manufacture in accordance with the method of the invention.
Figures 1C, 1D:
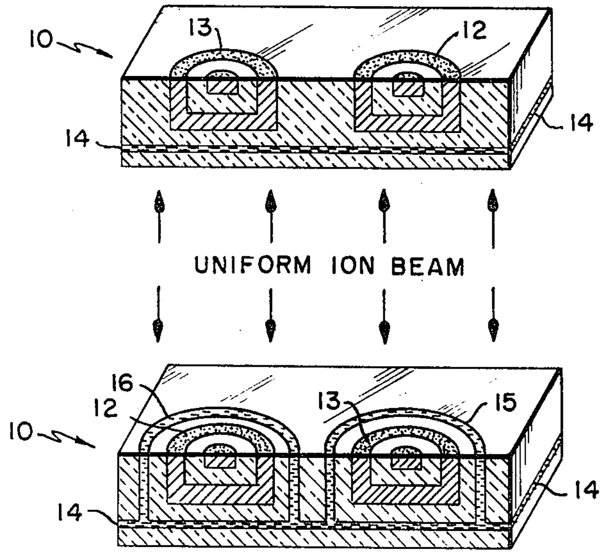

Referring now to FIG. 1*a*, an integrated circuit structure 10 has a substrate 11 which surrounds a plurality of semiconductor devices 12, 13, although many more may be utilized. Substrate 11, either n- or p-type polycrystalline silicon, although other semiconductor materials such as GaAs, GaP, etc., may be employed, has semiconductor devices 12, 13 diffused in it. Semiconductor devices 12, 13, npn transistors, are shown diffused in substrate 11 in their end view of FIG. 1*b*. The basic steps in the fabrication of dielectric isolation between semiconductor devices 12, 13 will be illustrated in connection with FIG. 1*c*, a half section of FIG. 1*a*. Using a high energy beam, on the order of 0.1 to 1.0 million electron volts, a uniform layer 14 of ions is implanted on the bottom face of substrate 11 just beneath the semiconductor devices 12, 13. The ions can be from any variety of gases, such as argon, helium, or hydrogen. Layer 14 is a uniform, narrow, (in depth and lateral) amorphous layer having resistivity values in excess of $10^6$ ohm-cm. Referring now to FIG. 1 *d*, the narrow ion beam is focussed on the top face of substrate 11, and the ion beam is programmed to intercept the deep amorphous layer 14 and then to re-write with decreasing energy, by varying the accelerating voltage of the beam, until amorphous layers 15 and 16 in the required configuration are formed right up to the top surface of silicon substrate 11. Layers 15 and 16, together with layer 14, thus form dielectric cups around semiconductor devices 12, 13. A narrow writing beam can be used to define the dielectric cups, though a broad uniform beam with masking could also be employed.

The above description and drawings show the present invention provides a new and improved semiconductor integrated circuit structure having improved isolation between discrete semiconductor regions. The dielectric cups can be made right in the host material with no need for an insulating substrate, thus eliminating the need for heteroepitaxy. No polishing, etching or other techniques are needed. Very complex dielectric cups can be formed by the beam writing or masking. Since the amorphous layers are radiation resistant, no latch-up can occur with a high radiation level electromagnetic pulse, thus providing for complete electrical isolation. This method can also be employed to produce surface dielectric (high resistivity) layers onto which other passive components may be deposited with adequate dielectric isolation from active device structures below the surface. The above technique can also be employed for surface passivation of device structures.

This setup allows tailoring of various device structures by changing certain parameters, such as the accelerating potential of the ions, the concentration of the ions, the time, and the ion beam diameter. The kinds of ions may vary from beam to beam. Furthermore, one ion beam may contain two different kinds of ions at the same time, and the beam diameter may be varied during the implantation process.

From the above description and drawings, it will be apparent that various modifications in the specific structures and procedures described in detail may be made within the scope of the invention. Therefore, the invention is not intended to be limited to the specific procedures and structures described except as may be required by the following claims.

What is claimed and desired to be secured by Letters Patent of The United States is:

1. A method of maintaining electrical isolation between semiconductor devices diffused in a substrate having top and bottom faces comprising the steps of:

directing a first ion beam at the bottom face of said substrate to form a uniform dielectric layer below said semiconductor devices;

directing a second ion beam at the top face of said substrate to intercept said uniform dielectric layer; and forming a dielectric cup around each of said semiconductor devices by varying the accelerating voltage of said second beam.

2. A method as recited in claim 1 wherein said ions are selected from the group consisting of argon, helium and hydrogen, wherein said substrate comprises polycrystalline silicon, and wherein said semiconductor devices comprise transistors.

* * * * *